US012593614B2

(12) United States Patent
van der Straten et al.

(10) Patent No.: US 12,593,614 B2
(45) Date of Patent: Mar. 31, 2026

(54) MRAM DEVICE WITH ANNULAR ELECTRODES

(71) Applicant: INTERNATIONAL BUSINESS MACHINES CORPORATION, Armonk, NY (US)

(72) Inventors: Oscar van der Straten, Guilderland Center, NY (US); Shanti Pancharatnam, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 784 days.

(21) Appl. No.: 17/935,146

(22) Filed: Sep. 26, 2022

(65) Prior Publication Data

US 2024/0107894 A1 Mar. 28, 2024

(51) Int. Cl.
H10N 50/80 (2023.01)
G11B 5/39 (2006.01)
(Continued)

(52) U.S. Cl.
CPC ........... H10N 50/10 (2023.02); G11B 5/3909 (2013.01); H10B 61/00 (2023.02); H10N 50/01 (2023.02);
(Continued)

(58) Field of Classification Search
CPC ........ H10N 50/01; H10N 50/10; H10N 52/80; H10B 61/00; G10R 33/098; G11B 5/3909; H10D 64/20; H10D 64/257; G11C 11/161
See application file for complete search history.

(56) References Cited

U.S. PATENT DOCUMENTS 8,634,231 B2 * 1/2014 Li .......................... H10D 48/40
365/158
9,502,640 B1 11/2016 Annunziata
(Continued)

FOREIGN PATENT DOCUMENTS

EP 2366199 B1 8/2014

OTHER PUBLICATIONS

Nguyen et al., "Novel approach for nano-patterning magnetic tunnel junctions stacks at narrow pitch: A route towards high density STT-MRAM applications", 2017 IEEE, IEDM17, International Electron Devices Meeting, pp. 38.5.1-38.5.4.
(Continued)

*Primary Examiner* — Wael M Fahmy
*Assistant Examiner* — Quinton A Brasfield
(74) *Attorney, Agent, or Firm* — Samuel A. Waldbaum

(57) ABSTRACT

A semiconductor device including a magnetic tunnel junction (MTJ) stack vertically aligned between an annular shaped bottom electrode and an annular shaped top electrode. A semiconductor device including a MTJ stack, vertically aligned between an annular shaped bottom electrode and an annular shaped top electrode, and an encapsulation layer surrounding vertical side surfaces of the MTJ stack, wherein the encapsulation layer does not surround the top electrode nor the bottom electrode. Forming a bottom electrode in a first inter-layer dielectric, forming a reference layer on the first inter-layer dielectric and on the bottom electrode, forming a tunnel barrier layer on the reference layer, forming a free layer on the tunnel barrier layer and patterning the reference layer, the tunnel barrier layer and the free layer into a magnetic tunnel function (MTJ) stack vertically aligned over the bottom electrode, while not patterning the bottom electrode nor the first inter-layer dielectric.

13 Claims, 24 Drawing Sheets

200

(51) Int. Cl.

| | | |
|---|---|---|
| *H10B 61/00* | (2023.01) | |
| *H10N 50/01* | (2023.01) | |
| *H10N 50/10* | (2023.01) | |
| *G11C 11/16* | (2006.01) | |

(52) U.S. Cl.
CPC ............ *H10N 50/80* (2023.02); *G11C 11/161* (2013.01); *G11C 2211/5615* (2013.01)

(56) References Cited

U.S. PATENT DOCUMENTS

| | | | |
|---|---|---|---|
| 9,559,294 | B2 | 1/2017 | Hsu |
| 2009/0209050 | A1 | 8/2009 | Wang |
| 2011/0049654 | A1* | 3/2011 | Li ......................... G11C 11/161 |
| | | | 257/E29.323 |
| 2011/0049655 | A1 | 3/2011 | Assefa |
| 2014/0197504 | A1 | 7/2014 | Moriyama |
| 2015/0064805 | A1 | 3/2015 | Hsieh |
| 2015/0104884 | A1 | 4/2015 | Lee |
| 2021/0193912 | A1* | 6/2021 | Gupta ................. G11C 11/1655 |
| 2021/0375988 | A1 | 12/2021 | Ko |
| 2022/0020920 | A1* | 1/2022 | Chen ...................... H10N 50/10 |
| 2022/0037588 | A1 | 2/2022 | Araki |
| 2022/0367566 | A1* | 11/2022 | Diaz ...................... H10B 61/20 |
| 2023/0138005 | A1* | 5/2023 | Kao ....................... H10B 61/22 |
| | | | 257/421 |
| 2023/0246064 | A1* | 8/2023 | Mukherjee ......... H10N 70/8836 |
| | | | 438/3 |

OTHER PUBLICATIONS

Wang et al., "Optimization on Dry-Etching Process for High-Density Stt-Mram", IEEE Transactions on Nanotechnology, vol. 20, 2021, pp. 161-167.

* cited by examiner 106
104

X

X

108

110

100

100

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

Section X-X

MRAM DEVICE WITH ANNULAR ELECTRODES

BACKGROUND

The present invention relates, generally, to the field of semiconductor manufacturing, and more particularly to fabricating a magnetic tunnel junction device with annular electrodes.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack vertically aligned between an annular shaped bottom electrode and an annular shaped top electrode.

According to an embodiment of the present invention, a semiconductor device is provided. The semiconductor device including a magnetic tunnel junction (MTJ) stack, vertically aligned between an annular shaped bottom electrode and an annular shaped top electrode, and an encapsulation layer surrounding vertical side surfaces of the MTJ stack, wherein the encapsulation layer does not surround the top electrode nor the bottom electrode.

According to an embodiment of the present invention, a method is provided. The method including forming a bottom electrode in a first inter-layer dielectric, forming a reference layer on the first inter-layer dielectric and on the bottom electrode, forming a tunnel barrier layer on the reference layer, forming a free layer on the tunnel barrier layer and patterning the reference layer, the tunnel barrier layer and the free layer into a magnetic tunnel function (MTJ) stack vertically aligned over the bottom electrode, while not patterning the bottom electrode nor the first inter-layer dielectric.

BRIEF DESCRIPTION OF THE DRAWINGS

The following detailed description, given by way of example and not intended to limit the invention solely thereto, will best be appreciated in conjunction with the accompanying drawings, in which:

FIG. 11 illustrates a cross-sectional view of the semiconductor structure of FIG. 10 along section line X-X, according to an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
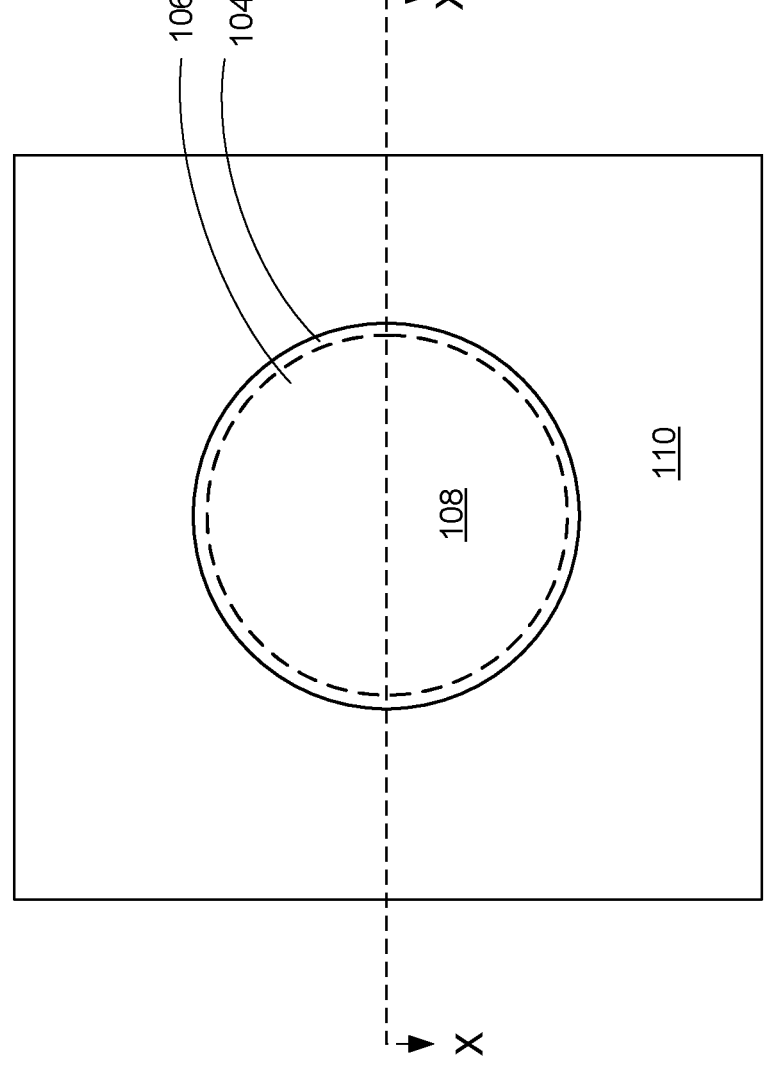
FIG. 1 illustrates a top view of a semiconductor structure at an intermediate stage of fabrication, according to an exemplary embodiment.
Figure 1:

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The MRAM stack layers may be conformally formed using known techniques. In formation of the MTJ stacks layers, the reference layer is formed on a dielectric and a bottom electrode. The tunneling barrier layer is formed on the reference layer. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and opposite the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

A potential problem when manufacturing MRAM devices are MRAM tunnel barrier shorts. MRAM tunnel barrier shorts may occur when patterning an MTJ stack. For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by subtractive patterning of blanket MTJ stacks between two metal layers into a pillar. Reactive ion etch (RIE), and ion beam etch (IBE) processing of such MTJ stacks presents a major challenge, as it typically leads to shorts due to re-sputtering of thick bottom metal layers onto MTJ stack sidewalls. There is a need for embedded MTJ structures formed by methods with a reduced risk of shorts due to metal re-sputtering.

The traditional method of forming an MTJ stack includes forming several stacked material layers, including material for a bottom electrode, materials for MTJ layers including a reference layer, a tunnel barrier and a free layer, and material for a top electrode. These several stacked material layers are simultaneously patterned to form the MTJ stack with the bottom electrode and the top electrode. When patterning these several stacked material layers, the material for the bottom electrode and the material for the top electrode have a high risk of re-sputtering onto the MTJ layers, including the reference layer, the tunnel barrier and the free layer. The re-sputtered material of the bottom electrode and the top electrode can cause shorts on the tunnel barrier. After patterning these several stacked material layers, an encapsulation layer surrounding vertical side surfaces of the bottom electrode, the MTJ layers and the top electrode is formed.

The present invention related to fabricating an MTJ stack with a dielectric underlayer. The dielectric underlayer prevents metal re-sputtering from material of a bottom electrode and material of a top electrode. An inter-layer dielectric may be formed on a lower metal line, which is the dielectric underlayer. A bottom electrode may be formed in an opening in the inter-layer dielectric. A metal liner may surround a lower surface and an outer surface of the bottom electrode. The bottom electrode may be annular shaped, with a dielectric in a center portion of the bottom electrode. Material layers for the MTJ stack of a reference layer, a tunnel barrier and a free layer may be formed on the inner-level dielectric and on the bottom electrode. Patterning of the MTJ stack of the reference layer, the tunnel barrier and the free layer may be done without exposing any portion of the bottom electrode, thus eliminating re-sputtering of the bottom electrode onto the MTJ stack. An encapsulation layer may surround vertical side surfaces of the MTJ stack of the reference layer, the tunnel barrier and the free layer. A second inter-layer dielectric may surround the MTJ stack of the reference layer, the tunnel barrier and the free layer. A third inter-layer dielectric may be formed on the second inter-layer dielectric and the MTJ stack. A top electrode may be formed in an opening in the third inter-layer dielectric over the MTJ stack. The third inter-layer dielectric and the encapsulation layer protects the MTJ stack from any re-sputtering of the top electrode material. A metal liner may surround a lower surface and an outer surface of the top electrode. The top electrode may be annular shaped, with a dielectric in a center portion of the bottom electrode. The resulting MTJ device has the encapsulation layer surrounding only the MTJ stack of the reference layer, the tunnel barrier and the free layer and not surrounding the top electrode nor the bottom electrode.

The present invention relates to fabricating a MTJ device with an annular bottom electrode and an annular top electrode. An annular electrode is an electrode with a central region of the electrode removed such that current flows into the MTJ structure only from the annular edges of the electrode. The annular electrode may be ring shaped from a top view. Alternatively, the annular electrode may be rectangular shaped. The annular electrodes may have a metal liner, such as tungsten nitride (WN), titanium nitride (TiN) and the annular electrode may include tungsten (W), molybdenum (Mo) or hafnium (Hf). Alternatively, the annular electrodes may not have a metal liner.

A second potential problem when manufacturing MRAM devices is MRAM pillar circular edge roughness (CER). For high performance MRAM devices based on perpendicular magnetic tunnel junction (MTJ) structures, well-defined interfaces and interface control are essential. MTJ structures typically include a Co-based synthetic anti-ferromagnet (SAF), a CoFeB-based reference layer, a MgO-based tunnel barrier, a CoFeB-based free layer, and cap layers containing e.g. Ta and/or Ru. Embedded MTJ structures are usually formed on a bottom electrode (BE) by subtractive patterning of blanket MTJ stacks into pillars between two metal levels. Typically, a polycrystalline metal is applied as hardmask material for subtractive patterning of blanket MTJ stacks. Grain boundaries and defects in the polycrystalline metal hardmask can be transferred into the MTJ pillar during patterning, resulting in MTJ pillars with high CER (circular edge roughness) which can negatively impact MRAM performance. There is a need for embedded MTJ structures with reduced CER (circular edge roughness).

An advantage of the annular top electrode and annular bottom electrode is elimination of metal re-sputtering and a low circular edge roughness (CER).

The present invention relates to fabricating a MTJ device using an amorphous dielectric hard mask for patterning the MTJ pillar. An amorphous dielectric hard mask does not contain grain boundaries or defects within its structure, resulting in a smooth outer surface of the dielectric hard mask after hard mask patterning. After transfer of the hard mask pattern downwards into the MTJ stack during MTJ stack patterning, the resulting MTJ pillar will also exhibit a smooth outer surface, i.e., possess low circular edge roughness (CER). Using a dielectric material which is patterned rather than a traditional hard mask material provides a low circular edge roughness (CER) compared to a traditional hard mask material when patterning the MTJ stack. A low circular edge roughness (CER) helps to improve MRAM performance. The electrical and magnetic properties of the MRAM device will exhibit reduced variability. In comparison, traditionally a polycrystalline metal is applied as a hard mask material for subtractive patterning of blanket MTJ stacks. Grain boundaries/defects in the polycrystalline metal hard mask can be transferred into the MTJ pillar during patterning, resulting in MTJ pillars with high CER (circular edge roughness) which can negatively impact MRAM performance.

Figure 2:
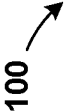
FIG. 2 illustrates a cross-sectional view of the semiconductor structure of FIG. 1 along section line X-X, according to an exemplary embodiment.
Figure 2:
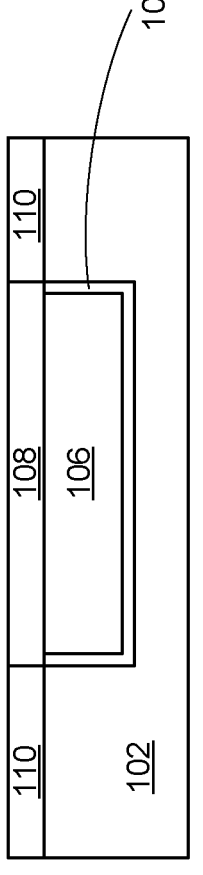

Referring now to FIG. 1 and, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line X-X. The structure 100 may be formed or provided. The structure 100 may include an inter-layer dielectric (hereinafter "ILD") 102, a liner 104, a lower metal wire 106, an inter-layer dielectric (hereinafter "ILD") 110 and a metal cap 108.

The structure 100 may include several back end of line ("BEOL") layers (not shown). In general, the back end of line (BEOL) is the second portion of integrated circuit fabrication where the individual devices (transistors, capacitors, resistors, etc.) are interconnected with wiring on the wafer. The ILD 102 may be formed on the BEOL layers.

The ILD 102 may be formed by depositing or growing a dielectric material, followed by a chemical mechanical polishing (CMP) or etch steps. The ILD 102 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 102 may include one or more layers. In an embodiment, the ILD 102 may include any dielectric material such as silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high-density plasma oxide, borophosphosilicate glass (BPS G), or any combination thereof or any other suitable dielectric material.

The lower metal wire 106 may be formed by first patterning one or more trenches (not shown) into the ILD 102, lining the one or more trenches with the liner 104, and filling the one or more openings.

The liner 104 separates the conductive interconnect material of the lower metal wire 106 from the ILD 102. The liner 104 may be composed of, for example, tantalum nitride (TaN), tantalum (Ta), titanium (Ti), titanium nitride (TiN), or a combination thereof. The liner 104 may be deposited utilizing a conventional deposition process such as, for example, CVD, plasma enhanced chemical vapor deposition (PECVD), PVD or ALD. The liner 104 may be 10 nm thick, although a thickness less than or greater than 10 nm may be acceptable. The liner 104 surrounds a lower horizontal surface and a vertical side surface of the lower metal wire 106.

In an embodiment, the lower metal wire 106 is formed from a conductive material layer which is blanket deposited on top of the structure 100, and directly on a top surface of the liner 104, filling the one or more trenches (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 106 is formed by damascene, or patterned from the conductive material layer, using known patterning and etching techniques.

There may be any number of openings in the ILD 102, each filled with the liner 104 and the lower metal wire 106, on the structure 100.

A planarization process, such as, for example, chemical mechanical polishing (CMP), may be done to remove excess material from a top surface of the structure 100 such that upper horizontal surfaces of the lower metal wire 106, the liner 104 and the ILD 102 are coplanar.

In an embodiment, the lower metal wire 106 may have a thickness ranging from about 10 nm to about 100 nm, although a thickness less than 10 nm and greater than 100 nm may be acceptable.

Figure 3:
FIG. 3 illustrates a cross-sectional view of the semiconductor structure along section line X-X, and illustrates formation of inter-level dielectric layer and patterning the inter-level dielectric layer, according to an exemplary embodiment.
Figure 3:
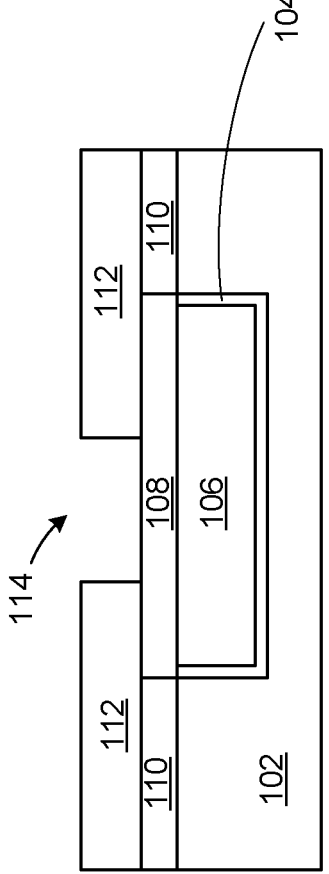

Referring now to FIG. 3, a cross-sectional view of the structure 100 is shown, along section line X-X, according to an embodiment. An inter-layer dielectric (hereinafter "ILD") 112 may be formed. An opening 114 in the ILD 112 may be formed.

The ILD 112 may be conformally formed on the structure 100 as described for the ILD 102, on the ILD 110 and the metal cap 108. The opening 114 in the ILD 112 may be formed by methods known in the arts, such as forming a hard mask, patterning the hard mask, and a combination of wet/dry etch, and removing the hard mask. The opening 114 may be above the metal cap 108 and expose a portion of an upper surface of the metal cap 108.

Figure 4:
FIG. 4 illustrates a cross-sectional view of the semiconductor structure along section line X-X and illustrates formation of a liner, according to an exemplary embodiment.
Figure 4:
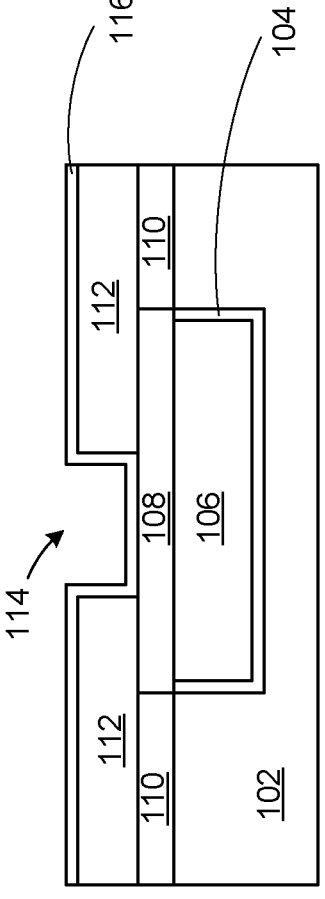

Referring now to FIG. 4, a cross-sectional view of the structure 100 is shown, along section line X-X, according to an embodiment. A metal liner 116 may be formed.

The metal liner 116 may be formed conformally on the structure 100 on the ILD 112 and on the metal cap 108. The metal liner 116 may partially fill the opening 114.

In an embodiment, the metal liner 116 is formed from a conductive material layer which is blanket deposited on top of the structure 100, and directly on a top surface of the liner 104, filling the one or more trenches (not shown). The conductive material layer may include materials such as, for example tungsten nitride (WN), titanium nitride (TiN). The conductive material can be formed by for example, chemical vapor deposition (CVD), physical vapor deposition (PVD), and atomic layer deposition (ALD) or a combination thereof. The metal liner 116 is formed by damascene, or patterned from the conductive material layer, using known patterning and etching techniques.

Figure 5:
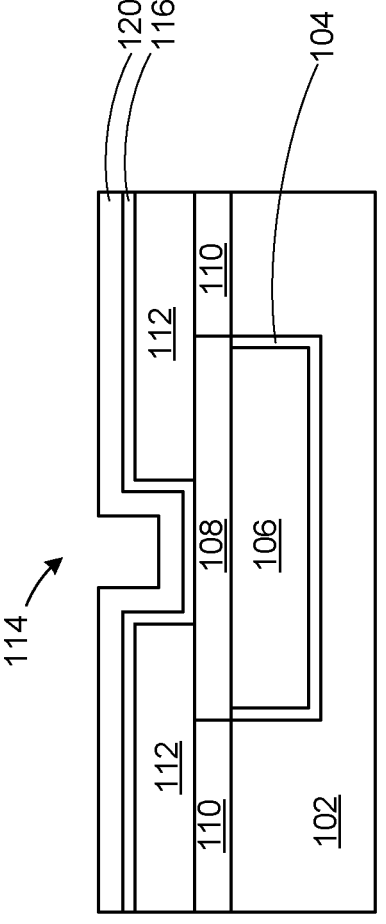
FIG. 5 illustrates a cross-sectional view of the semiconductor structure along section line X-X and illustrates a metal layer deposition, according to an exemplary embodiment.
Figure 5:

Referring now to FIG. 5, a cross-sectional view of the structure 100 is shown, along section line X-X, according to an embodiment. A bottom electrode metal layer 120 may be formed.

The bottom electrode metal layer 120 may be conformally formed on the structure 100, on the metal liner 116. In an embodiment, the bottom electrode metal layer 120 is formed from a conductive material layer which is blanket deposited on top of the structure 100, and directly on a top surface of the metal liner 116 and may partially fill the opening 114. The conductive material layer may include materials such as, for example, tungsten (W), molybdenum (Mo), hafnium (Hf). Materials may be chosen with a low probability of metal diffusion. The conductive material layer may be deposited using typical deposition techniques, for example, physical vapor deposition, atomic layer deposition, molecular layer deposition, and chemical vapor deposition.

Figure 6:
FIG. 6 illustrates a cross-sectional view of the semiconductor structure along section line X-X and illustrates a directional metal etch of the metal liner and the metal layer, according to an exemplary embodiment.
Figure 6:
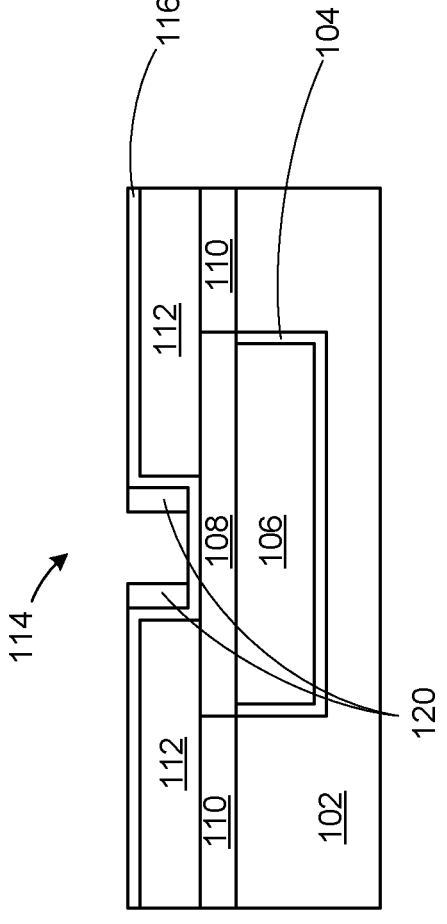

Referring now to FIG. 6, a cross-sectional view of the structure 100 is shown, along section line X-X, according to an embodiment. Portions of the bottom electrode metal layer 120 may be removed.

An anisotropic etching technique, such as, for example, reactive ion etching (RIE) may be used to remove portions of the bottom electrode metal layer 120 on the metal liner. Remaining portions of the bottom electrode metal layer 120 may remain in the opening 114.

Figure 7:
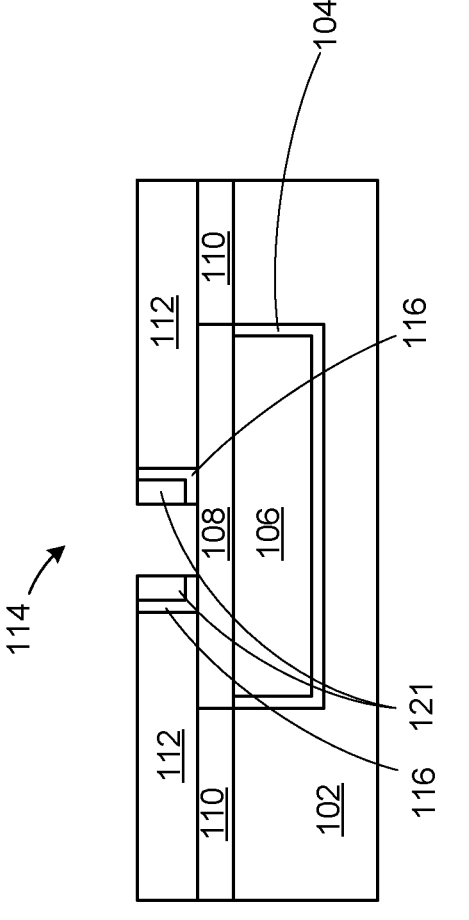
FIG. 7 illustrates a cross-sectional view of the semiconductor structure along section line X-X and illustrates a further directional etch of the metal liner and the metal layer, according to an exemplary embodiment.
Figure 7:

Referring now to FIG. 7, a cross-sectional view of the structure 100 is shown, along section line X-X, according to an embodiment. Portions of the metal liner 116 and additional portions of the bottom electrode metal layer 120 may be removed.

An anisotropic etching technique, such as, for example, reactive ion etching (RIE) may be used to remove portions of the metal liner 116 on the ILD 112 and portions of the metal liner 116 on the metal cap 108 in the opening 114. An additional portion of the bottom electrode metal layer 120 may be removed. Remaining portions of the bottom electrode metal layer 120 may remain in the opening 114 and may now be referred to as the bottom electrode 121.

An upper surface of the ILD 112 is exposed. The metal liner 116 provides protection between the bottom electrode 121 and the ILD 112, and between the bottom electrode 121 and the metal cap 108. A portion of an upper surface of the metal cap 108 is exposed.

Figure 8:
FIG. 8 illustrates a cross-sectional view of the semiconductor structure along section line X-X and illustrates formation of an inter-level dielectric layer, according to an exemplary embodiment.
Figure 8:
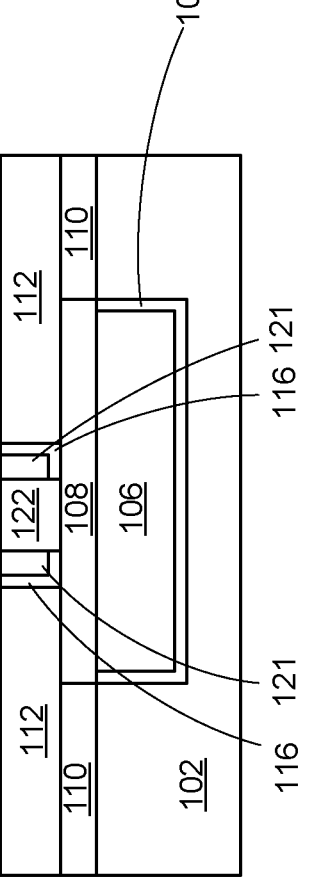

Referring now to FIG. 8, a cross-sectional view of the structure 100 is shown, along section line X-X, according to an embodiment. An inter-layer dielectric (hereinafter "ILD") 122 may be formed.

The ILD 122 may be formed conformally on the structure 100, on the ILD 112, the metal cap 108, the bottom electrode 121 and the metal liner 116. The ILD 122 may fill remaining portions of the opening 114. The ILD 122 may be formed as described for the ILD 102.

A planarization process, such as, for example, chemical mechanical polishing (CMP), may be done to remove excess material from a top surface of the structure 100 such that upper horizontal surfaces of the ILD 122, the ILD 112, the metal liner 116 and the bottom electrode 121 are coplanar. In an embodiment, the bottom electrode 121 may have a thickness ranging from about 10 nm to about 100 nm, although a thickness less than 10 nm and greater than 100 nm may be acceptable.

The bottom electrode 121 is annular shaped with the ILD 122 in a center portion of the bottom electrode 121, such that conductive elements of the bottom electrode 121 encompassed an outer edge only of the bottom electrode 121, as viewed from above. The bottom electrode 121 may be aligned above the metal cap 108 and the lower metal wire 106.

The bottom electrode 121 has less conductive material than a traditional electrode, such as a via shaped electrode with similar material throughout the via. Having a lower volume of material helps to reducing a chance of metal re-sputtering when patterning the MTJ stack. In comparison, a filled via made of a similar size of the combined volume of the bottom electrode 121 and ILD 122, would contain 100% conductive material. The bottom electrode 121 contains approximately 20% of a volume of conductive material of the filled via. The bottom electrode 121 may contain more than 20% or less than 20% of a volume of conductive material of the filled via.

Figure 9:
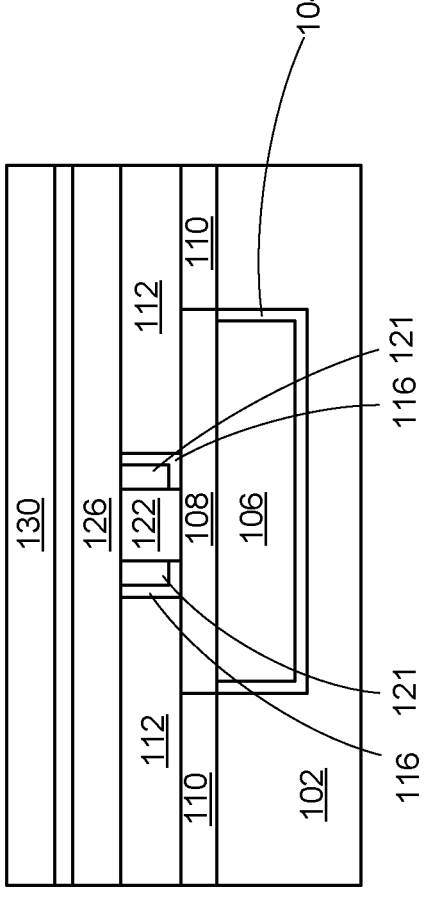
FIG. 9 illustrates a cross-sectional view of the semiconductor structure along section line X-X and illustrates formation of a reference layer, a tunneling barrier and a free layer, according to an exemplary embodiment.

Referring now to FIG. 9, a cross-sectional view of the structure 100 is shown, along section line X-X, according to an embodiment. A reference layer 126, a tunneling barrier 128 and a free layer 130 may be formed.

The reference layer 126 may be formed conformally on the structure 100. The reference layer 126 may cover an upper horizontal surface of the ILD 122, the ILD 112, the metal liner 116 and the bottom electrode 121.

The tunneling barrier 128 may be formed conformally on the structure 100 and may cover an upper horizontal surface of the reference layer 126.

The free layer 144 may be formed conformally on the structure 100 and may cover an upper horizontal surface of the tunneling barrier 128.

A planarization process, such as, for example, chemical mechanical polishing (CMP), may be done to remove excess tunneling barrier 128 material from a top surface of the structure 100.

Figure 10:
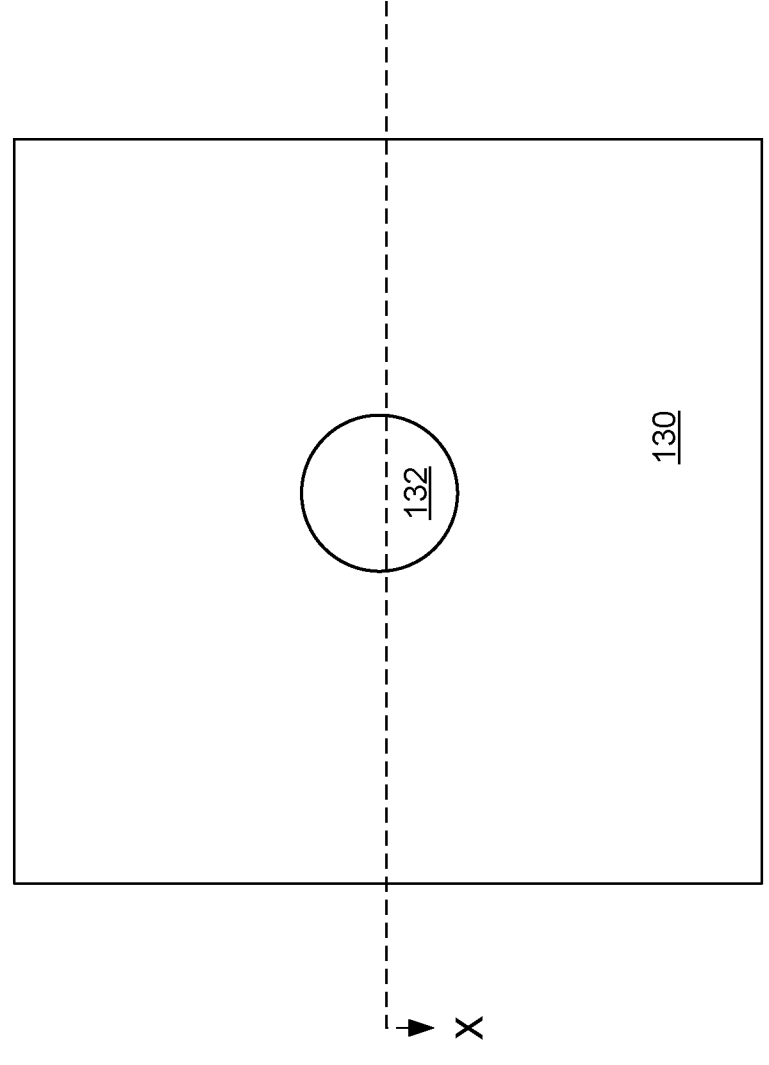
FIG. 10 illustrates a top view of the semiconductor structure along section line X-X and illustrates formation of a hard mask, according to an exemplary embodiment.
Figure 11:
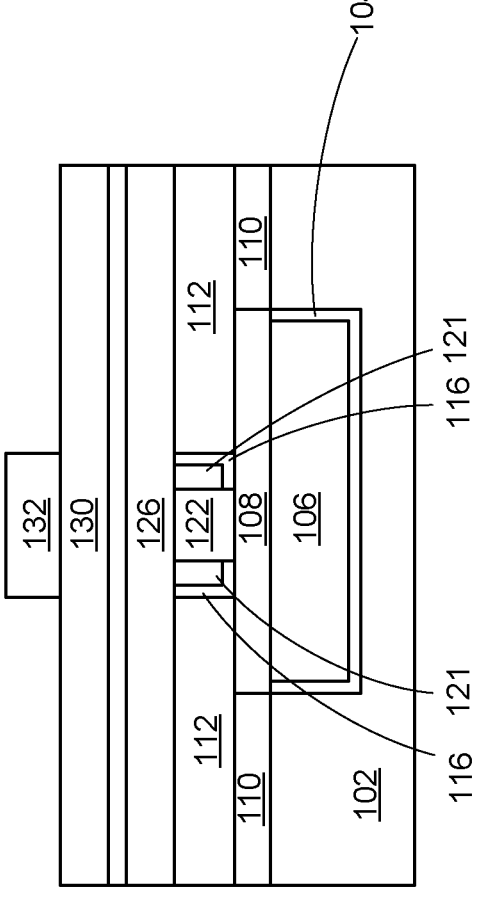
FIG. 11 illustrates a cross-sectional view of the semiconductor structure along section line X-X and illustrates formation of a hard mask, according to an exemplary embodiment.
Figure 11:
Figure 11:

Referring now to FIGS. 10 and 11, a top view and a cross-sectional view of the structure 100 along section line X-X, respectively, are shown according to an embodiment. A hard mask 132 may be formed.

The hard mask 132 may be formed on the free layer 130 and patterned using methods known in the arts. The hard mask 132 may include a dielectric material which is amorphous or nanocrystalline, should have a minimum number of defects and must have a smooth surface. The hard mask 132 may be formed by depositing or growing a dielectric material, followed by a chemical mechanical polishing (CMP) or etch steps. The hard mask 132 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 102 may include one or more layers. In an embodiment, the hard mask 132 may include any dielectric material such as silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The hard mask 132 includes a dielectric material which is patterned rather than a traditional hard mask material. Using the dielectric material for the hard mask provided a low circular edge roughness compared to a traditional hard mask material when patterning the MTJ stack of the reference layer 126, the tunneling barrier 128 and the free layer 130.

The hard mask 132 may have a circular pattern, as seen from above. The circular pattern of the hard mask 132 has low circular edge roughness. This helps to improve MTJ device performance by reducing variability of electrical and magnetic properties of the MTJ device.

Figure 12:
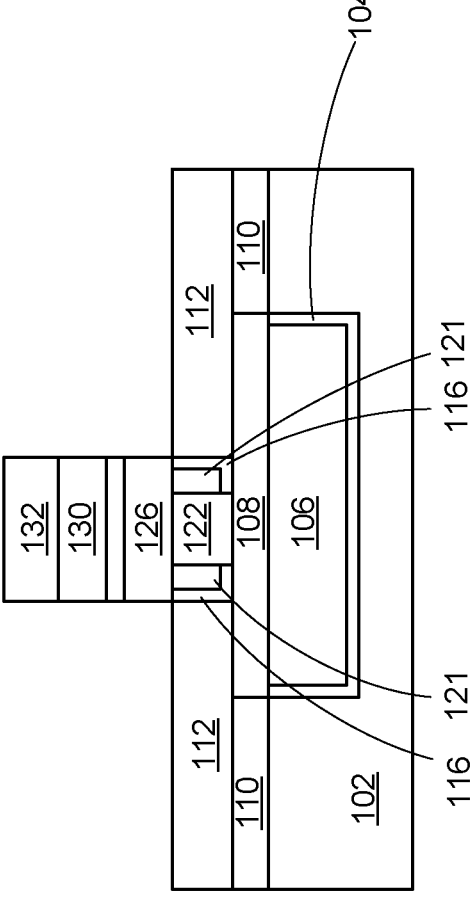
FIG. 12 illustrates a cross-sectional view of the semiconductor structure along section line X-X and illustrates patterning of the reference layer, the tunneling barrier and the free layer, according to an exemplary embodiment.
Figure 12:

Referring now to FIG. 12, a cross-sectional view of the structure 100 is shown, along section line X-X, according to an embodiment. Portions of the reference layer 126, the tunneling barrier 128 and the free layer 130 may be removed.

The portions of the reference layer 126, the tunneling barrier 128 and the free layer 130 may be removed selective to the hard mask 132 and the ILD 112. For example, reactive ion etch (RIE) and ion beam etch (IBE) may be used to remove portions of each of the reference layer 126, the tunneling barrier 128 and the free layer 130.

Remaining portions of the reference layer 126, the tunneling barrier 128 and the free layer 130 may be vertically aligned above the bottom electrode 121 and the metal liner 116. An upper surface of the ILD 112 may be exposed.

The bottom electrode 121 is not exposed during removal of the portions of the reference layer 126, the tunneling barrier 128 and the free layer 130, due to the metal liner 116. This helps to prevent re-sputtering of the bottom electrode 121 on to vertical side surfaces of the remaining portions of the reference layer 126, the tunneling barrier 128 and the free layer 130.

During patterning to remove the portions of the reference layer 126, the tunneling barrier 128 and the free layer 130, there is less metal re-sputtering of the bottom electrode 121 due to the ILD 112 surrounding the bottom electrode. Since only a dielectric is present surrounding the bottom electrode 121, no metal can be re-sputtered from the bottom electrode 121.

Figure 13:
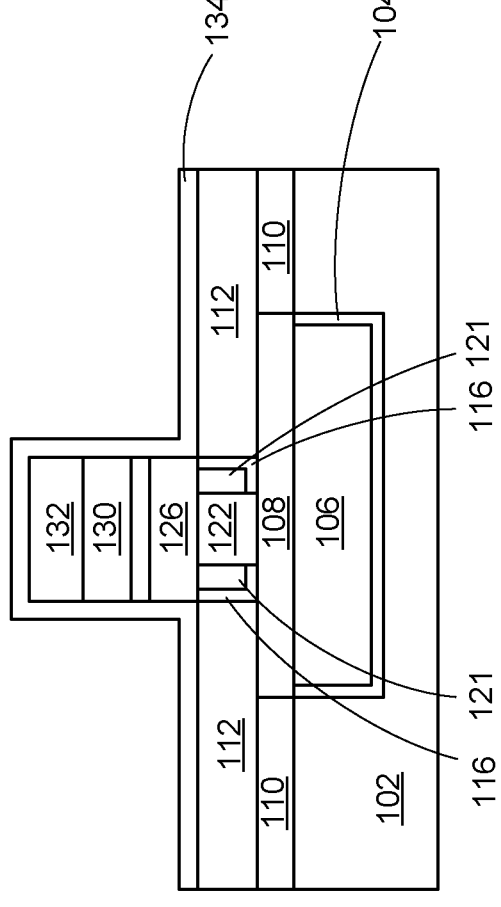
FIG. 13 illustrates a cross-sectional view of the semiconductor structure along section line X-X and illustrates deposition of an encapsulation layer, according to an exemplary embodiment.

Referring now to FIG. 13, a cross-sectional view of the structure 100 is shown, along section line X-X, according to an embodiment. An encapsulation layer 134 may be deposited.

The encapsulation layer 134 can be formed by a conformal dielectric material deposition on the structure 100. The encapsulation layer 134 may cover horizontal upper surfaces of the ILD 112 and the hard mask 132, and be on vertical side surfaces of the hard mask 132, the reference layer 126, the tunneling barrier 128 and the free layer 130. The encapsulation layer 134 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. The encapsulation layer 134 may include any dielectric material such as silicon nitride (SiN), silicon boron carbon nitride (SiBCN), silicon oxide carbon nitride (SiOCN), aluminum oxide (AlOx), SiC, and may include a single layer or may include multiple layers of dielectric material.

Figure 14:
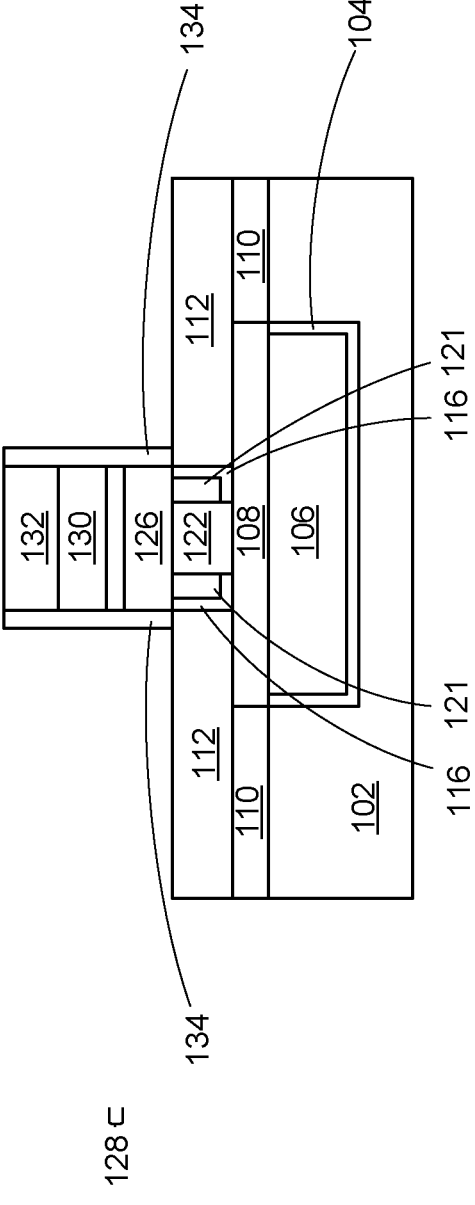
FIG. 14 illustrates a cross-sectional view of the semiconductor structure along section line X-X and illustrates patterning of the encapsulation layer, according to an exemplary embodiment.

Referring now to FIG. 14, a cross-sectional view of the structure 100 is shown, along section line X-X, according to an embodiment. Portions of the encapsulation layer 134 may be removed.

An anisotropic process, such as reactive ion etch (RIE) or ion beam etch (IBE), may be used to remove the encapsulation layer 134 from horizontal surfaces of the ILD 112 and the hard mask 132. As a result, the encapsulation layer 134 may remain on vertical side surfaces of the hard mask 132, the reference layer 126, the tunneling barrier 128 and the free layer 130.

Figure 15:
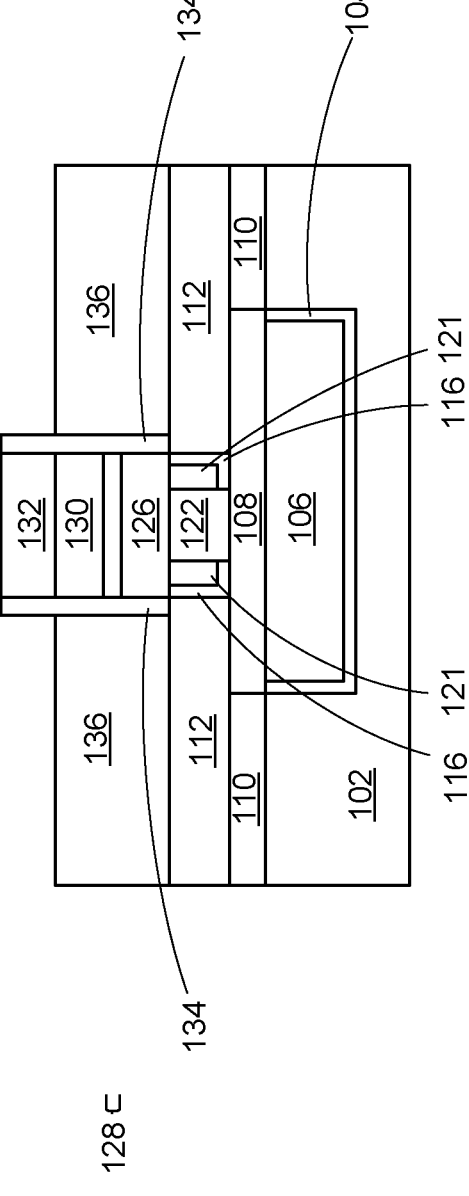
FIG. 15 illustrates a cross-sectional view of the semiconductor structure along section line X-X and illustrates deposition of a dielectric, according to an exemplary embodiment.

Referring now to FIG. 15, a cross-sectional view of the structure 100 is shown, along section line X-X, according to an embodiment. An inter-layer dielectric (hereinafter "ILD") 136 may be formed.

The ILD 136 may be conformally formed on the structure 100 and may be recessed. The ILD 136 may be formed as described for the ILD 102. Remaining portions of the ILD 136 may be on an upper horizontal surface of the ILD 112 and on vertical side surfaces of the encapsulation layer 134. An upper horizontal surface of the ILD 136 may be below an upper horizontal surface of the hard mask 132 and the encapsulation layer 134, as measured from an upper horizontal surface of the ILD 102.

Figure 16:
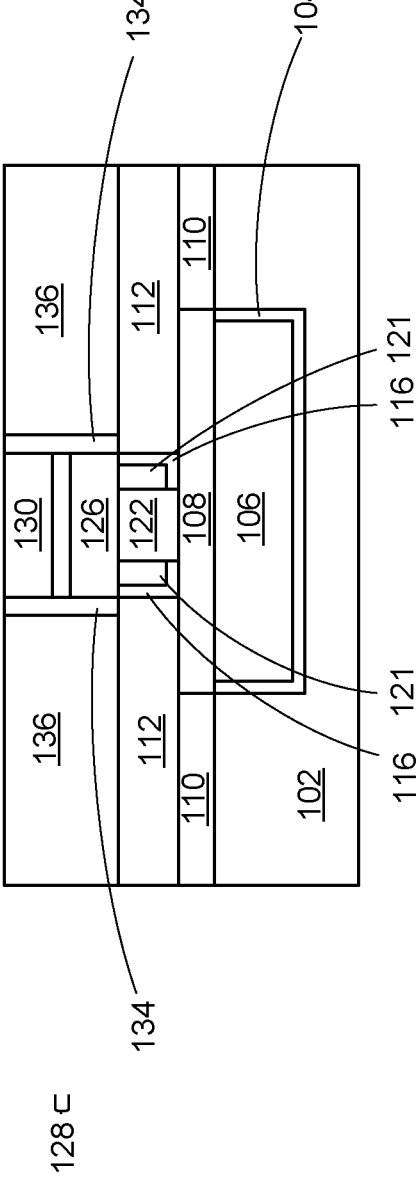
FIG. 16 illustrates a cross-sectional view of the semiconductor structure along section line X-X and illustrates removal of the hard mark and portions of the dielectric, according to an exemplary embodiment.

Referring now to FIG. 16, a cross-sectional view of the structure 100 is shown, along section line X-X, according to an embodiment. The hard mask 132 may be removed. Portions of the encapsulation layer 134 may be removed.

The hard mask 132 and the portions of the encapsulation layer 134 may be removed in one or more steps. A combination of wet/dry etch may be used selective to the ILD 136 and the reference layer 130. A planarization process, such as, for example, chemical mechanical polishing (CMP), may be done forming coplanar upper horizontal surfaces of the ILD 136, the reference layer 130 and the encapsulation layer 134.

Figure 17:
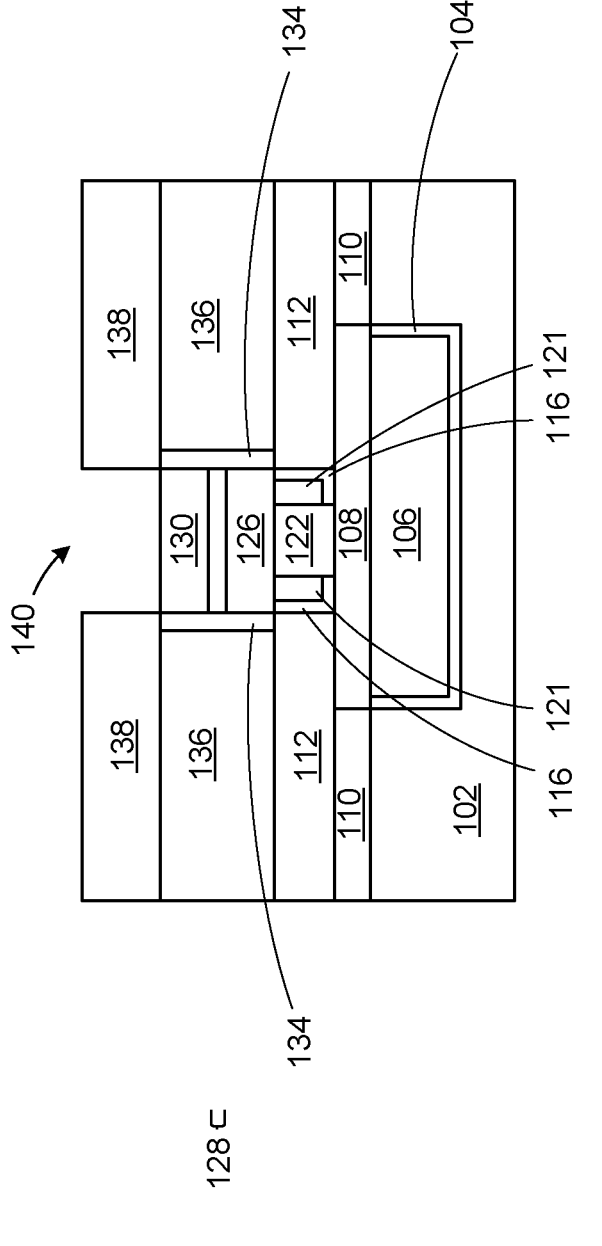
FIG. 17 illustrates a cross-sectional view of the semiconductor structure along section line X-X and illustrates deposition of a dielectric and forming an opening in the dielectric, according to an exemplary embodiment.

Referring now to FIG. 17, a cross-sectional view of the structure 100 is shown, along section line X-X, according to an embodiment. An inter-layer dielectric (hereinafter "ILD") 138 may be formed. An opening 140 in the ILD 138 may be formed.

The ILD 138 may be conformally formed on the structure 100 as described for the ILD 102 on the ILD 136, the free layer 130 and the encapsulation layer 134. The opening 140 in the ILD 112 may be formed by methods known in the arts, such as forming a hard mask, patterning the hard mask, and a combination of wet/dry etch, and removing the hard mask. The opening 140 may be above the free layer 130 and expose an upper surface of the free layer 130.

Figure 18:
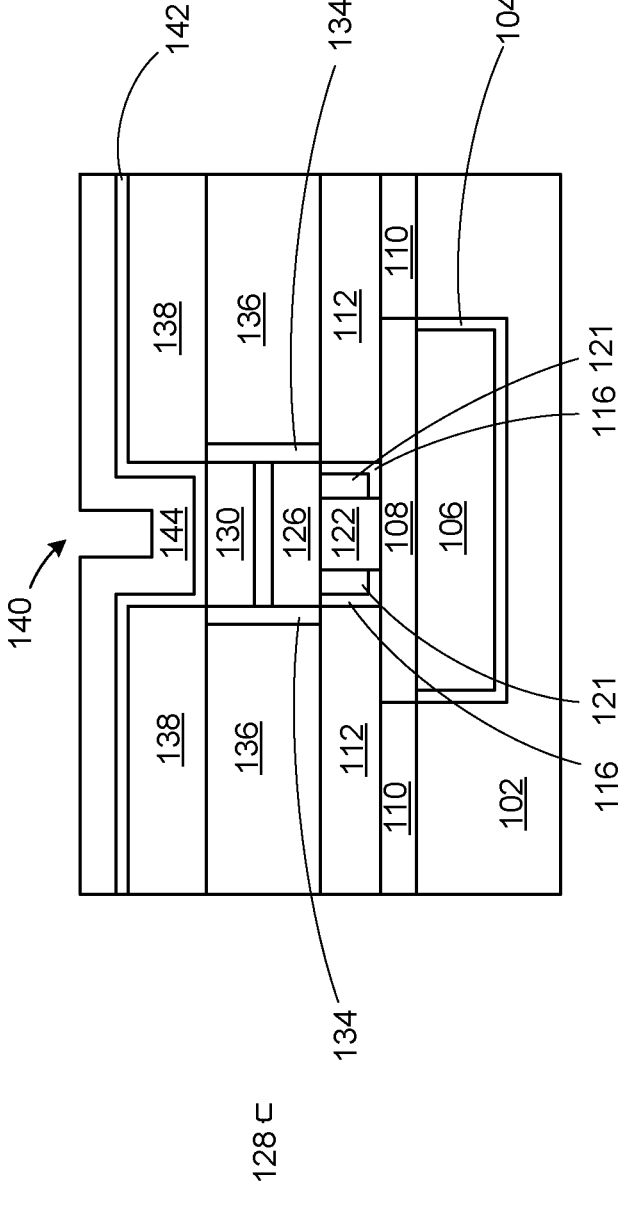
FIG. 18 illustrates a cross-sectional view of the semiconductor structure along section line X-X and illustrates a metal liner deposition and a metal layer deposition, according to an exemplary embodiment.

Referring now to FIG. 18, a cross-sectional view of the structure 100 is shown, along section line X-X, according to an embodiment. A metal liner 142 may be formed. A top electrode metal layer 144 may be formed.

The metal liner 142 may be formed conformally on the structure 100 on the ILD 138 and the free layer 130. The metal liner 142 may partially fill the opening 140. The metal liner 142 may be formed as described for the metal liner 116.

The top electrode metal layer 144 may be conformally formed on the structure 100, on the metal liner 142. The top electrode metal layer 144 may partially fill the opening 140. The top electrode metal layer 144 may be formed as described for the bottom electrode metal layer 120.

Figure 19:
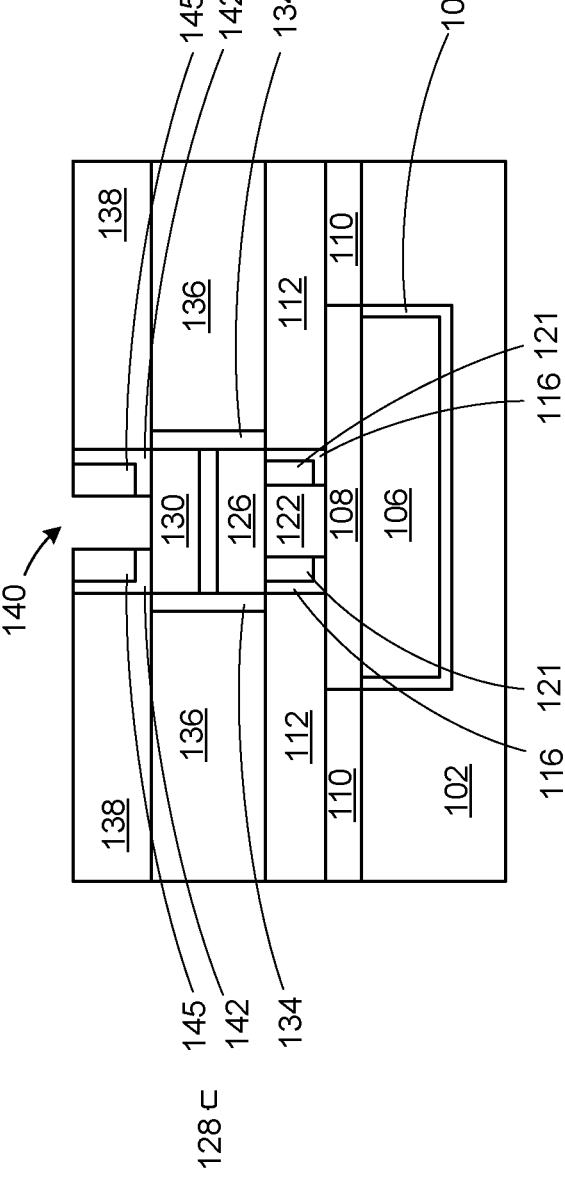
FIG. 19 illustrates a cross-sectional view of the semiconductor structure along section line X-X and illustrates a directional etch of the metal liner and the metal layer, according to an exemplary embodiment.

Referring now to FIG. 19, a cross-sectional view of the structure 100 is shown, along section line X-X, according to an embodiment. Portions of the top electrode metal layer 144 and portions of the metal liner 142 may be removed.

An anisotropic etching technique, such as, for example, reactive ion etching (RIE) may be used to remove portions of the top electrode metal layer 144 on the metal liner 142 on the ILD 138. Remaining portions of the top electrode metal layer 144 may remain in the opening 140 and may now be referred to as the top electrode 145.

An anisotropic etching technique, such as, for example, reactive ion etching (RIE) may be used to remove portions of the metal liner 142 on the ILD 138 and portions of the metal liner 142 on the free layer 130 in the opening 140.

An upper surface of the ILD 138 is exposed. The metal liner 142 provides protection between the top electrode 145 and the ILD 138, and between the top electrode 145 and the free layer 130. An upper portion of the free layer 130 is exposed.

Figure 20:
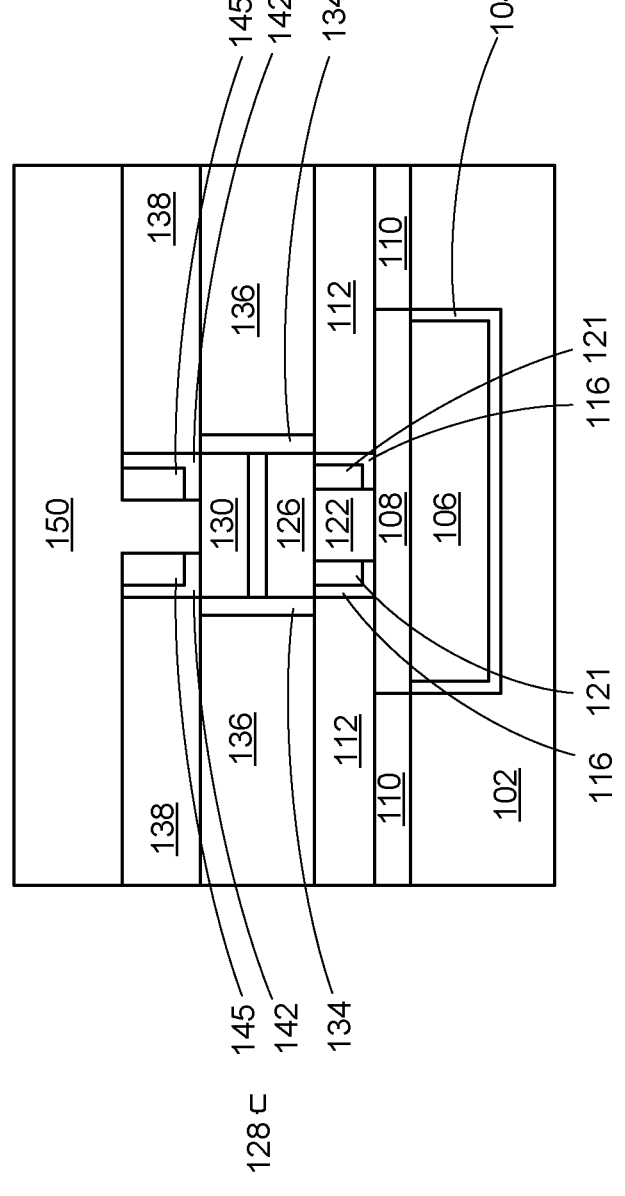
FIG. 20 illustrates a cross-sectional view of the semiconductor structure along section line X-X and illustrates formation of a dielectric, according to an exemplary embodiment.

Referring now to FIG. 20, a cross-sectional view of the structure 100 is shown, along section line X-X, according to an embodiment. An inter-layer dielectric (hereinafter "ILD") 150 may be formed.

The ILD 150 may be formed conformally on the structure 100, on the ILD 138, the free layer 130, the top electrode 145 and the metal liner 142. The ILD 150 may fill remaining portions of the opening 140. The ILD 150 may be formed as described for the ILD 102.

Figure 21:
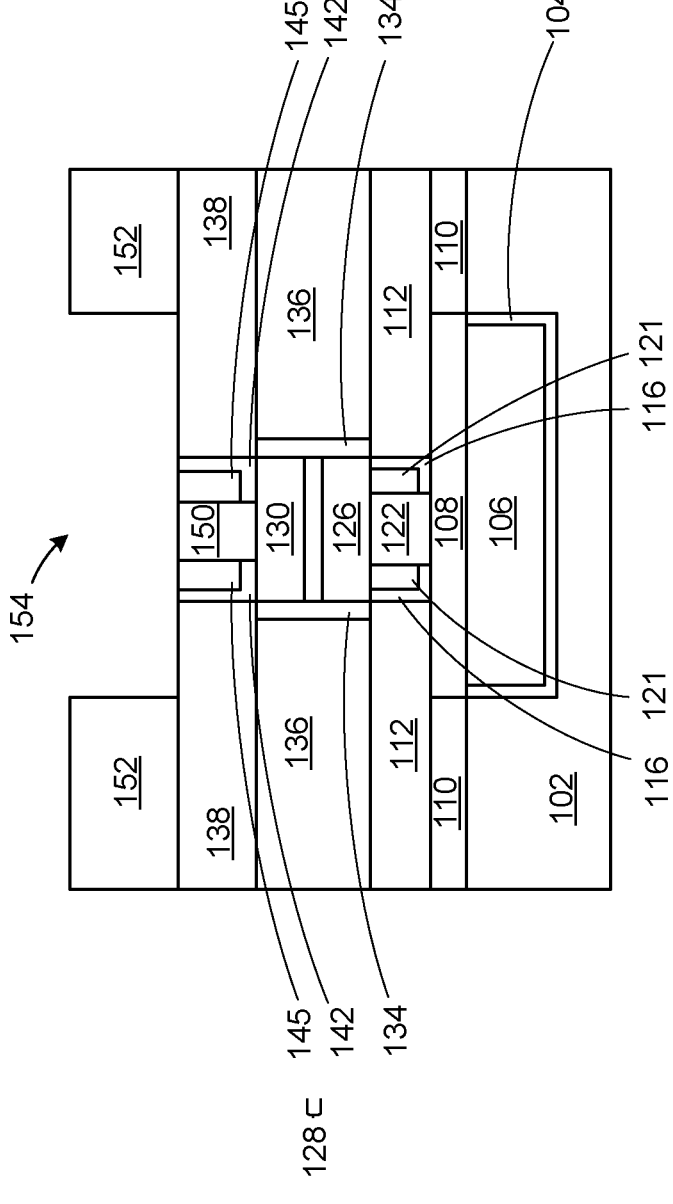
FIG. 21 illustrates a cross-sectional view of the semiconductor structure along section line X-X and illustrates forming an opening in the dielectric, according to an exemplary embodiment.

Referring now to FIG. 21, a cross-sectional view of the structure 100 is shown, along section line X-X, according to an embodiment. Portions of ILD 150 may be removed. An inter-layer dielectric (hereinafter "ILD") 152 may be formed. An opening 154 may be formed.

A planarization process, such as, for example, chemical mechanical polishing (CMP), may be done to remove excess material from a top surface of the structure 100 such that upper horizontal surfaces of the ILD 138, the ILD 150, the metal liner 142 and top electrode 145 are coplanar. In an embodiment, the top electrode 145 may have a thickness ranging from about 10 nm to about 100 nm, although a thickness less than 10 nm and greater than 100 nm may be acceptable.

The top electrode 145 is annular shaped with the ILD 150 in a center portion of the top electrode 145, such that conductive elements of the top electrode 145 encompassed an outer edge only of the top electrode 145, as viewed from above. The top electrode 145 may be aligned above the free layer 130, the tunneling barrier 128, the reference layer 126, the bottom electrode 121, the metal cap 108 and the lower metal wire 106.

The ILD 152 may be formed conformally on the structure 100, on the ILD 140, the ILD 150, the top electrode 145 and the metal liner 142. The ILD 150 may be formed as described for the ILD 102.

The opening 154 in the ILD 152 may be formed by methods known in the arts, such as forming a hard mask, patterning the hard mask, and a combination of wet/dry etch, and removing the hard mask. The opening 154 may be above the top electrode 145. The opening 154 may expose upper horizontal surfaces of the top electrode 145, the metal liner 142, the ILD 150 and the IDL 138.

Figure 22:
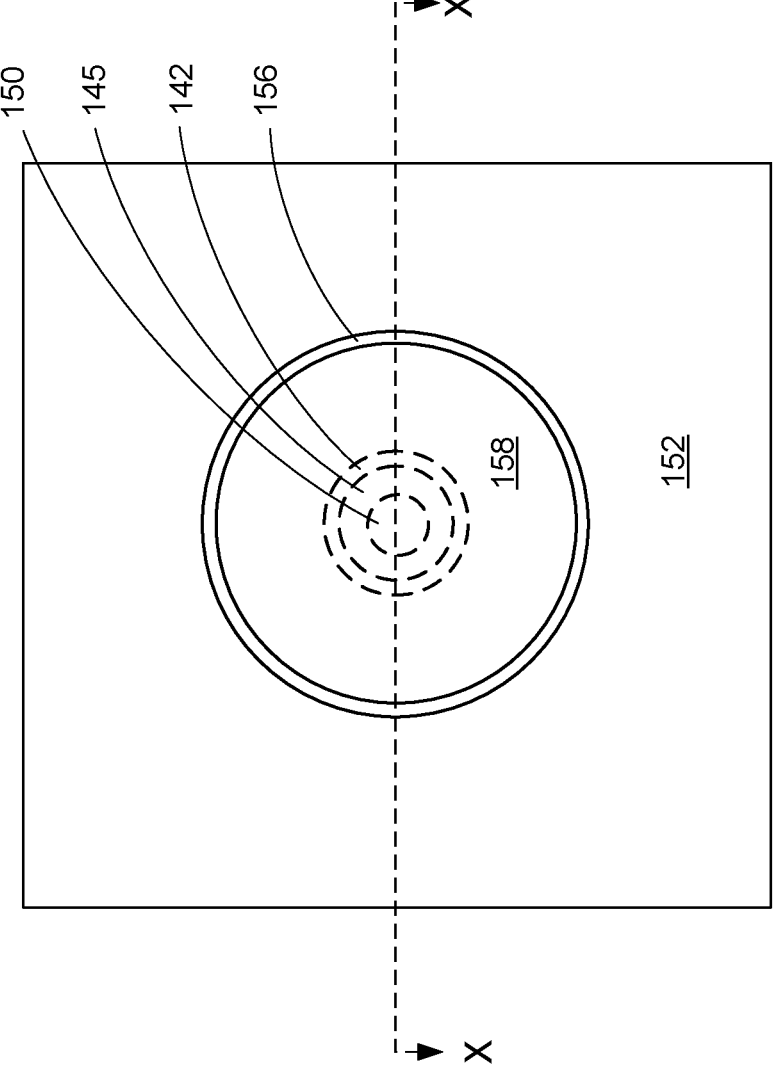
FIG. 22 illustrates a top view of the semiconductor structure and illustrates formation of an upper metal wire, according to an exemplary embodiment.
Figure 23:
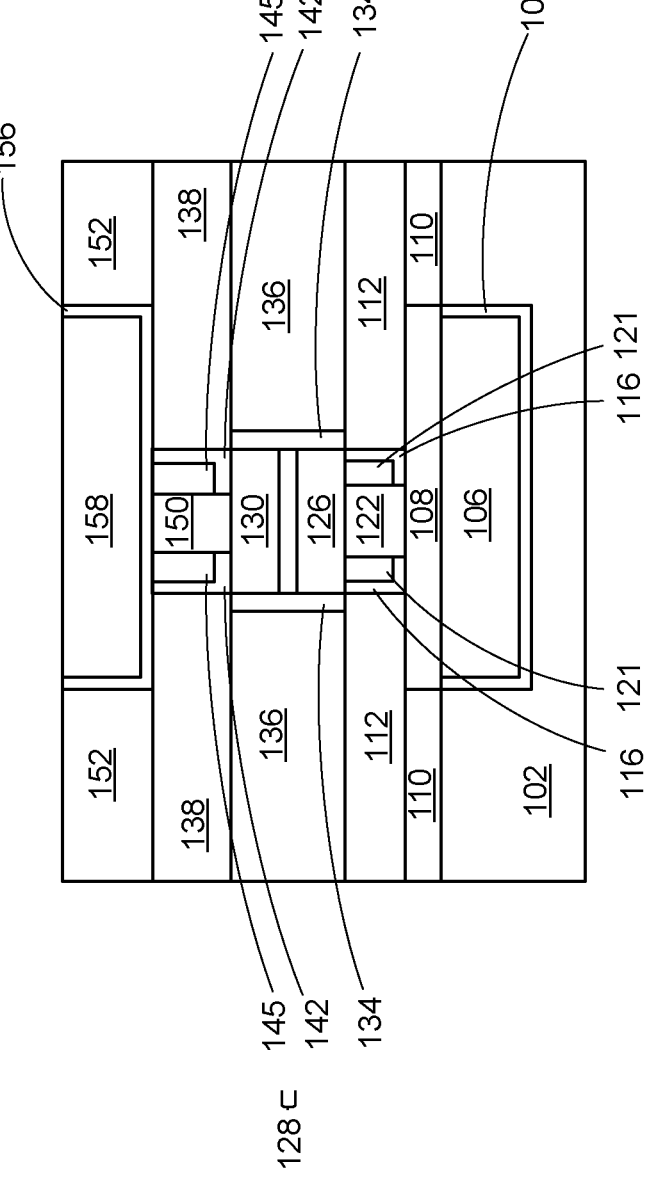
FIG. 23 illustrates a cross-sectional view of the semiconductor structure according to FIG. 22, along section line X-X, according to an exemplary embodiment.

Referring now to FIGS. 22 and 23, a top view and a cross-sectional view along section line X-X of the structure 100 is shown, respectively, according to an embodiment. A liner 156 and an upper metal wire 158 may be formed.

The upper metal wire 158 may be formed by lining the opening 154 with the liner 156 and filling a portion of the opening 154. The liner 156 separates the conductive interconnect material of the upper metal wire 158 from the ILD 152, the ILD 138, the ILD 150, the metal liner 142 and the top electrode 145. The liner 156 may be formed as described for the liner 104. The liner 156 surround a lower horizontal surface and a vertical side surface of the upper metal wire 158.

The upper metal wire 158 may be formed as described for the lower metal wire 106. There may be any number of openings 154 in the ILD 152, each filled with the liner 156 and the upper metal wire 158, on the structure 100.

A planarization process, such as, for example, chemical mechanical polishing (CMP), may be done to remove excess material from a top surface of the structure 100 such that upper horizontal surfaces of the upper metal wire 158, the liner 156 and the ILD 152 are coplanar.

As shown in the figures, one MTJ memory cell is formed, however any number of MTJ memory cells may be formed.

The structure 100 has vertically aligned portions of the MTJ stack, including the bottom electrode 121, the reference layer 126, the tunneling barrier 128, the free layer 130 and the top electrode 145. The MTJ stack is vertically aligned between the lower metal wire 106 and the upper metal wire 158.

The structure 100 provides an improved MTJ stack with less shorts due to metal re-sputtering due to the dielectric underlayer of the ILD 112 surrounding the bottom electrode 121 during patterning of the MTJ stack of the reference layer 126, the tunneling barrier 128 and the free layer 130 to prevent re-sputtering of the bottom electrode. Additionally, the MTJ stack has improved performance due to using a dielectric as the hard mask 132 when patterning the MTJ stack providing an improved lower circular edge roughness (CER) of the MTJ stack.

Figure 24:
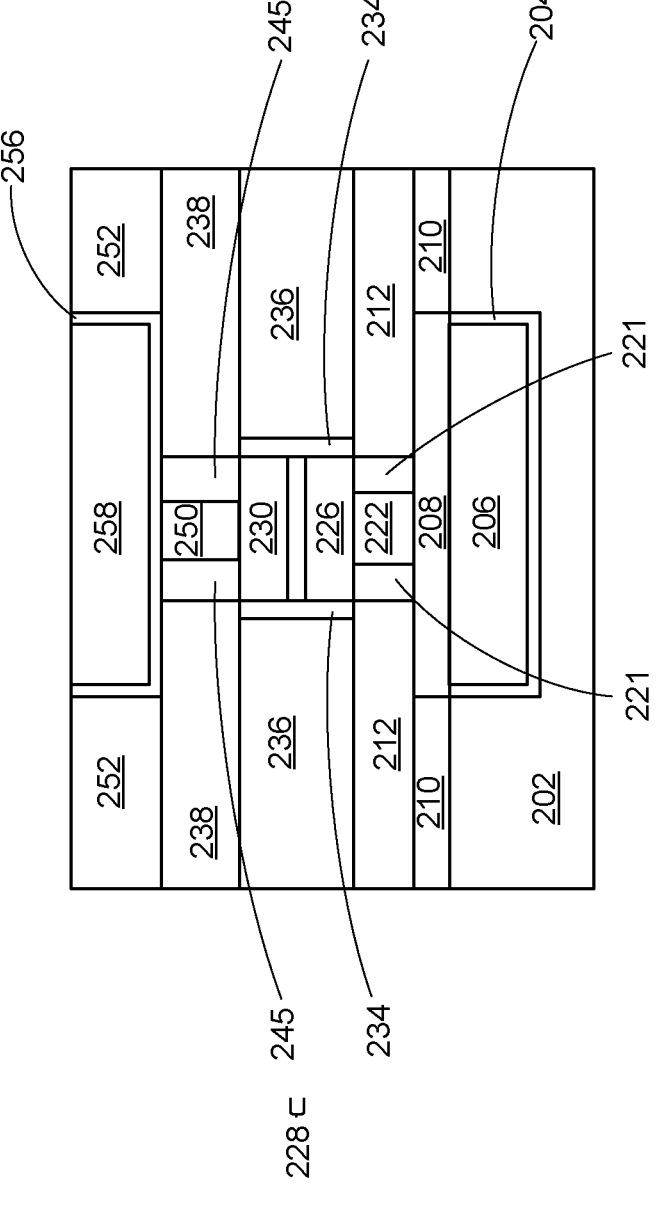
FIG. 24 illustrates a cross-sectional view of another semiconductor structure, according to an exemplary embodiment.

Referring now to FIG. 24, a cross-sectional view of a structure 200 is shown, according to an alternate embodiment.

The structure 200 may be formed or provided and may include an inter-layer dielectric (hereinafter "ILD") 202, a liner 204, a lower metal wire 206, an inter-layer dielectric (hereinafter "ILD") 210, a metal cap 208, an inter-layer dielectric (hereinafter "ILD") 212, a bottom electrode 221, an inter-layer dielectric (hereinafter "ILD") 222, an inter-layer dielectric (hereinafter "ILD") 236, an encapsulation layer 234, a reference layer 226, a tunneling barrier 228, a free layer 230, an inter-layer dielectric (hereinafter "ILD") 238, an inter-layer dielectric (hereinafter "ILD") 250, a top electrode 245, an inter-layer dielectric (hereinafter "ILD") 252, a liner 256 and an upper metal wire 258.

Items of the structure 200 may be formed as described for similarly named items of the structure 100, unless described otherwise.

In comparison of the structure 200 to the structure 100, the bottom electrode 221 and the upper electrode 245 are formed without a liner, such as the liner 104 and the metal liner 142.

The bottom electrode 221 directly contacts the ILD 210, the liner 204 and the lower metal wire 206. There is no liner between these layers. The top electrode 245 directly contacts the ILD 238 and the free layer 230. There is no liner between these layers.

The structure 200 may be easier to manufacture than the structure 100 as there are less processing steps as there is no liner for the bottom electrode 221 nor the top electrode 245.

The structure 200 provides an improved MTJ stack with less shorts due to metal re-sputtering due to the dielectric underlayer of the ILD 212 surrounding the bottom electrode 221 during patterning of the MTJ stack of the reference layer 226, the tunneling barrier 228 and the free layer 230 to prevent re-sputtering of the bottom electrode. Additionally, the MTJ stack has improved performance due to using a dielectric as a hard mask when patterning the MTJ stack providing an improved lower circular edge roughness (CER) of the MTJ stack.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a magnetic tunnel junction (MTJ) stack, vertically aligned between an annular shaped bottom electrode and an annular shaped top electrode; and
   a dielectric layer located in the center of the annular shaped bottom electrode, such that the annular shaped bottom electrode is located around the vertical sides of the dielectric layer, wherein the MTJ stack is located on top of the dielectric layer and the annular shaped bottom electrode.

2. The semiconductor device according to claim 1, wherein
   the MTJ stack comprises vertically aligned layers of a free layer, a tunneling barrier, and a reference layer.

3. The semiconductor device according to claim 1, wherein the annular shaped top electrode comprises a dielectric within the annular shaped top electrode.

4. The semiconductor device according to claim 1, further comprising:
   a bottom metal liner surrounding an outer surface and a lower surface of the annular shaped bottom electrode; and
   a top metal liner surrounding an outer surface and a lower surface of the annular shaped top electrode.

5. The semiconductor device according to claim 4, wherein
   the bottom metal liner and the top metal liner each comprise tungsten nitride (WN).

6. The semiconductor device according to claim 1, wherein
   the annular shaped bottom electrode and the annular shaped top electrode each comprise molybdenum.

7. The semiconductor device according to claim 1, further comprising:
   an encapsulation layer surrounding vertical side surfaces of the MTJ stack, wherein the encapsulation layer does not surround the top electrode nor the bottom electrode.

8. A semiconductor device comprising:
   a magnetic tunnel junction (MTJ) stack, vertically aligned between an annular shaped bottom electrode and an annular shaped top electrode;
   an encapsulation layer surrounding vertical side surfaces of the MTJ stack, wherein the encapsulation layer does not surround the top electrode nor the bottom electrode; and
   a dielectric layer located in the center of the annular shaped bottom electrode, such that the annular shaped bottom electrode is located around the vertical sides of the dielectric layer, wherein the MTJ stack is located on top of the dielectric layer and the annular shaped bottom electrode.

9. The semiconductor device according to claim 8, wherein
   the MTJ stack comprises vertically aligned layers of a free layer, a tunneling barrier, and a reference layer.

10. The semiconductor device according to claim 8, wherein the annular shaped top electrode comprises a dielectric within the annular shaped top electrode.

11. The semiconductor device according to claim 8, further comprising:

a bottom metal liner surrounding an outer surface and a lower surface of the annular shaped bottom electrode; and a top metal liner surrounding an outer surface and a lower surface of the annular shaped top electrode.

12. The semiconductor device according to claim 11, wherein the bottom metal liner and the top metal liner each comprise tungsten nitride (WN).

13. The semiconductor device according to claim 8, wherein the annular shaped bottom electrode and the annular shaped top electrode each comprise molydbenum.

\* \* \* \* \*